United States Patent [19]

Tani

[11] Patent Number: 5,745,394
[45] Date of Patent: Apr. 28, 1998

[54] HIGH SPEED ANALOG TO DIGITAL CONVERTER, DECIMATION AND STORAGE SYSTEM

[75] Inventor: Jon R. Tani, Palo Alto, Calif.

[73] Assignee: Hewlett Packard Company, Palo Alto, Calif.

[21] Appl. No.: 521,617

[22] Filed: Aug. 31, 1995

[51] Int. Cl.$^6$ .................... G06F 17/17; H03M 1/00; H03M 1/12
[52] U.S. Cl. .................... 364/724.1; 341/126; 341/155
[58] Field of Search .................. 364/724.01, 724.1, 364/718; 324/76.15, 76.16, 76.24, 76.38, 76.42, 76.47, 76.55, 76.58–76.63; 341/61, 87, 122–125, 139, 143, 144, 155, 156, 165, 172, 100, 102, 110, 120, 166; 342/194–197, 94, 95, 115, 135

[56] References Cited

U.S. PATENT DOCUMENTS

| | | | |
|---|---|---|---|
| 4,308,585 | 12/1981 | Jordan | 341/110 |
| 4,736,189 | 4/1988 | Katsumata et al. | 341/120 |
| 4,768,017 | 8/1988 | Gordon | 341/122 |
| 4,839,652 | 6/1989 | O'Donnell et al. | 341/122 |
| 4,922,452 | 5/1990 | Larsen et al. | 365/45 |
| 4,937,579 | 6/1990 | Maio et al. | 341/165 |
| 5,121,121 | 6/1992 | Grudkowski et al. | 341/172 |
| 5,206,944 | 4/1993 | Pilkenton | 395/425 |
| 5,485,152 | 1/1996 | Wilson et al. | 341/143 |

*Primary Examiner*—Reba I. Elmore
*Assistant Examiner*—Emmanuel L. Moise
*Attorney, Agent, or Firm*—Brian R. Short

[57] ABSTRACT

A high speed analog to digital sampling system. The invention allows for decimation and optimal storage of samples from an interleaved analog to digital conversion system. The circuit architecture provides for switchable flip-flops at the outputs of a set of interleaved analog to digital converters. Decimation is accomplished by only activating a selection of the analog to digital converters within the set of interleaved analog to digital converters. The flip-flops associated with the inactive analog to digital converters are configured to form a shift register. The samples of the activated analog to digital converters are shifted into the shift register. When all the flip-flops of the shift register are full, the samples are written to memory of the system. The shift register configuration allows the samples to be stored so that the allocation of system memory is optimized and the number of system memory writes is reduced. One embodiment of the invention includes presettable dividers for providing control over the rate at which the flip-flops are loaded with sampled data.

11 Claims, 7 Drawing Sheets

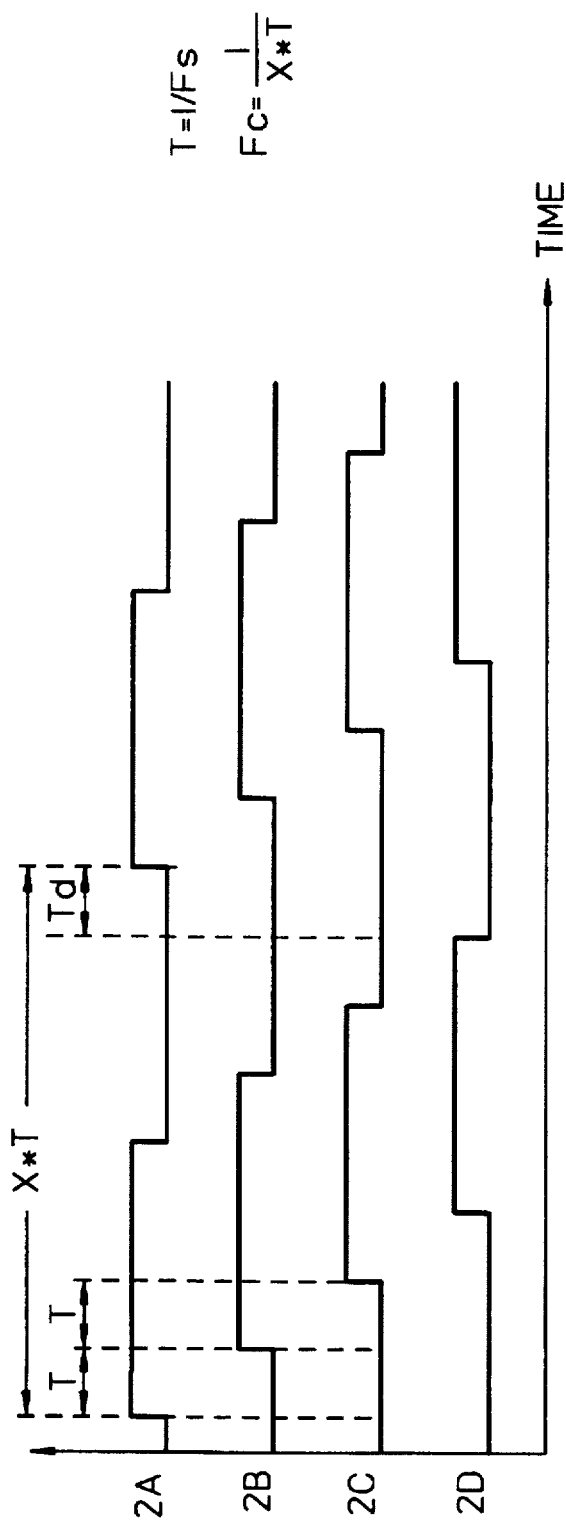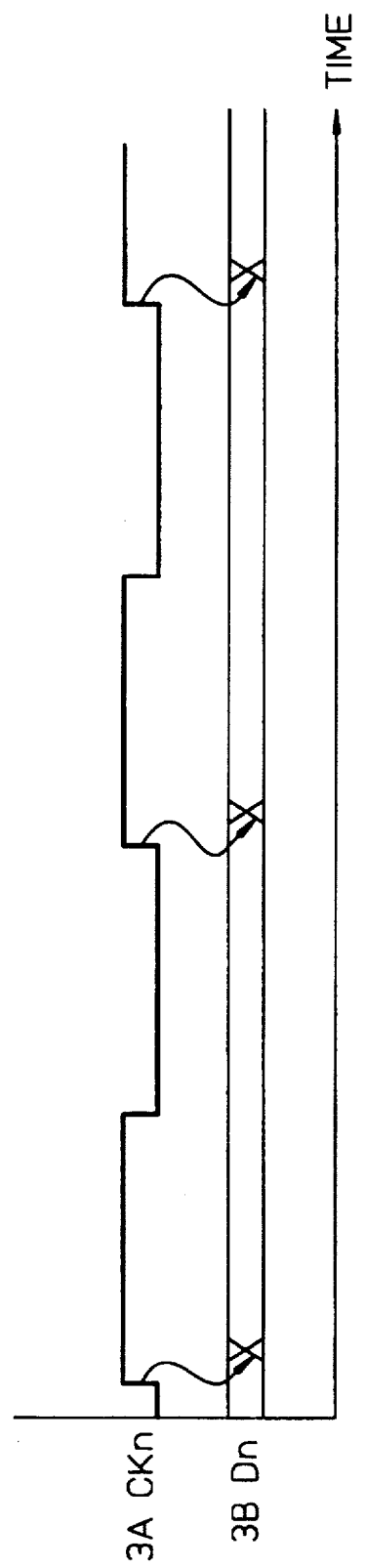
*Figure 2* (PRIOR ART)
*Figure 3* (PRIOR ART)

HIGH SPEED ANALOG TO DIGITAL CONVERTER, DECIMATION AND STORAGE SYSTEM

FIELD OF THE INVENTION

The invention pertains to high speed interleaved analog to digital conversion and memory storage. More specifically, it pertains to systematically delaying and shifting digital samples for minimizing memory writes and for maximizing the number of digital samples stored.

BACKGROUND

There is a constant need to increase the operational rate of analog to digital conversions of electronic signals. Analog to digital conversion at high sampling rates is required for measurement of the characteristics of rapidly changing analog signals. Analog to digital converters (ADCs) are commonly used in test instrumentation like oscilloscopes to digitally sample analog signals. The digitized signal samples are generally stored in digital memory.

One method of achieving a higher sampling rate is to interleave a plurality of slower speed ADCs all receiving the same analog signal input. This is accomplished by delaying the sampling clock signal between the clock inputs of the plurality of ADCs. FIG. 1 shows how the interleaved ADCs 102, 104, 106, 108 are configured to effectively obtain a much greater sampling rate than would be possible with individual ADCs. Each individual ADC has a peak or maximum sampling rate. By interleaving X number of ADCs, the maximum sampling rate of the plurality of ADCs is X times the individual ADC maximum sampling rate.

When the number X of ADCs is large and the sampling rate Fc of the sample clock 110 of the ADCs 102, 104, 106, 108 is fast, the sampled data to be stored in the memory cells 109 is generated too fast for a controller to generate specific memory addresses for every individual sample. Therefore, sampling and storing the samples in memory at fast rates requires that the ADCs 102, 104, 106, 108 be hard wired directly to the memory cells 109. The memory cells 109 depicted in FIG. 1 are X deep and m wide. To allow sampling and storing at the fastest rates, the ADCs 102, 104, 106, 108 and the memory 109 should be physically on the same integrated circuit. Physically locating the ADCs and memory on the same integrated circuit also lowers the total system cost and power dissipation.

When the sampled data is read out of the memory, the resulting data stream will appear to have been digitized by a single ADC at a sample rate of Fs. The sample rate Fs is given by X*Fc, where X is the number of ADCs interleaved, and Fc is the sample rate of each individual ADC 102, 104, 106, 108.

When the number of interleaved ADCs is small and the sampling rate Fs is low, the sampling clock can be distributed to the individual ADCs by a digital shift register or demultiplexer. When there are a large number of ADCs and the sampling rate Fs is high, this solution leads to excessive power dissipation. A better suited clocking system that has been used in the past is based on a chain of delay elements 114, 116, 118 as shown in FIG. 1. The timing diagrams for the system are shown by Traces 2A, 2B, 2C, 2D of FIG. 2. Each ADC 102, 104, 106, 108 is clocked at the sampling rate Fc by the sample clock 110. The delay elements 114, 116, 118 cause each successive ADC to digitize the input signal T (T=1/Fs) seconds later than the previous ADC. Trace 2A shows the clock signal (in this case Fc) for the first ADC 102. Trace 2B shows the clock signal of the second ADC 104 delayed in time by T. Trace 2C shows the clock signal of the third ADC 106 delayed in time by another T. Trace 2D shows the Xth ADC 108 clock signal which is the clock signal of the first ADC delayed in time by (X−1)*T. When the frequency Fs is in the multi-GHz, T is a fraction of a nanosecond. The delay T can be implemented only by very simple structures like digital inverters or logic gates. Once the T delays have been set, it is very difficult to change the delays by more than a few percent.

FIG. 3 shows that typically the analog signal is sampled on the rising edge of the clock signal and written into memory on the falling edge of the clock signal. Trace 3A shows the clock and Trace 3B shows the data for one of the X ADCs. The ADC produces a digitized sample on the positive edge of the clock. On the following negative clock edge the sample is written into memory.

There are limitations to the existing interleaved sampling systems. The system sampling rate Fs cannot be reduced by reducing the signal Fc 110 that clocks the individual ADCs 102, 104, 106, 108. The signal Fc cannot be reduced in frequency because the time delays 114, 116, 118 are set to T and can not be easily changed. Decreasing the frequency of the signal Fc leads to a lower average sampling rate, but because the delay T remains constant, the sampling takes place in bursts of samples at the maximum sampling rate Fs=1/T. The only way to reduce the sampling rate of the system shown in FIG. 1 is to ignore the samples of select ADCs. For example, to reduce the sampling rate by two, the sample of every second ADC would be ignored. However, ignoring the samples of ADCs reduces the number of stored samples. This is because the content of the memory cells filled by the ignored ADCs are useless. Therefore, memory on the chip is not fully utilized.

There is a need for a way to decimate the sampling rate of an interleaved sampling and storage system by turning ADCs off wherein the number of writes to memory are minimized and the signal samples are stored in such a way that usage of the system memory is optimized.

SUMMARY OF THE INVENTION

The present invention provides a unique method and apparatus for storing decimated sampled data from an interleaved sampling system. The storage technique optimizes the allocation of the sampled data stored in the system memory. The storage technique also saves power by turning off a selection of the sampling ADCs of the interleaved sampling system thereby saving ADC power consumption, and by making fewer writes to memory.

One embodiment of this invention utilizes a storage technique wherein X storage elements (flip-flops or latches) are connected to the outputs of X ADCs. The jth storage element can be switched to receive either the output of the jth ADC which the storage element corresponds with, or the output of the previous or (j−1)th storage element. When selected ADCs are turned off to decimate the sampled data, the input to the storage element corresponding to the non-selected ADC is switched to receive the output of the previous storage element. In operation, the sampled data of an active jth ADC is stored in a corresponding jth storage element. On the next clock sample, the sampled data in that jth storage element is shifted into the (j+1)th storage element and the new sample is stored in the jth storage element. If the decimation factor is N, then this process will repeat N times. After the Nth clock sample, a data sample will have been stored in all of the storage elements. With all of the memory elements loaded with sampled data, a system controller will write all of the samples stored in the storage elements into system memory cells. With the addition of the storage elements, it is possible to optimally store the sampled data in system memory and to reduce the number of writes to system memory cells by the decimation factor N.

Another embodiment of this invention includes placing presettable dividers prior to the clock inputs of the storage elements. The addition of the presettable dividers allows the decimation factor N to be greater than the interleave factor X. A first level of decimation is obtained by turning off a selection of the ADCs. A second level of decimation is obtained by ignoring a selection of the data samples that are output from the active (not turned off) ADCs. The selection of ADC data samples are ignored by reducing the number of samples that are clocked into the storage elements. Which samples are ignored is determined through the use of the presettable dividers. To operate properly, the presettable counters must be preset or initialized to a particular initial state S, for a given divider ratio R. The decimation factor is increased by increasing the divider ratio R.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2 is a timing diagram of the waveforms of the signal sampling interleave and storage system shown in FIG. 1.

FIG. 3 is a timing diagram of the clock and data waveform of the system of FIG. 1.

DETAILED DESCRIPTION

Figure 1:
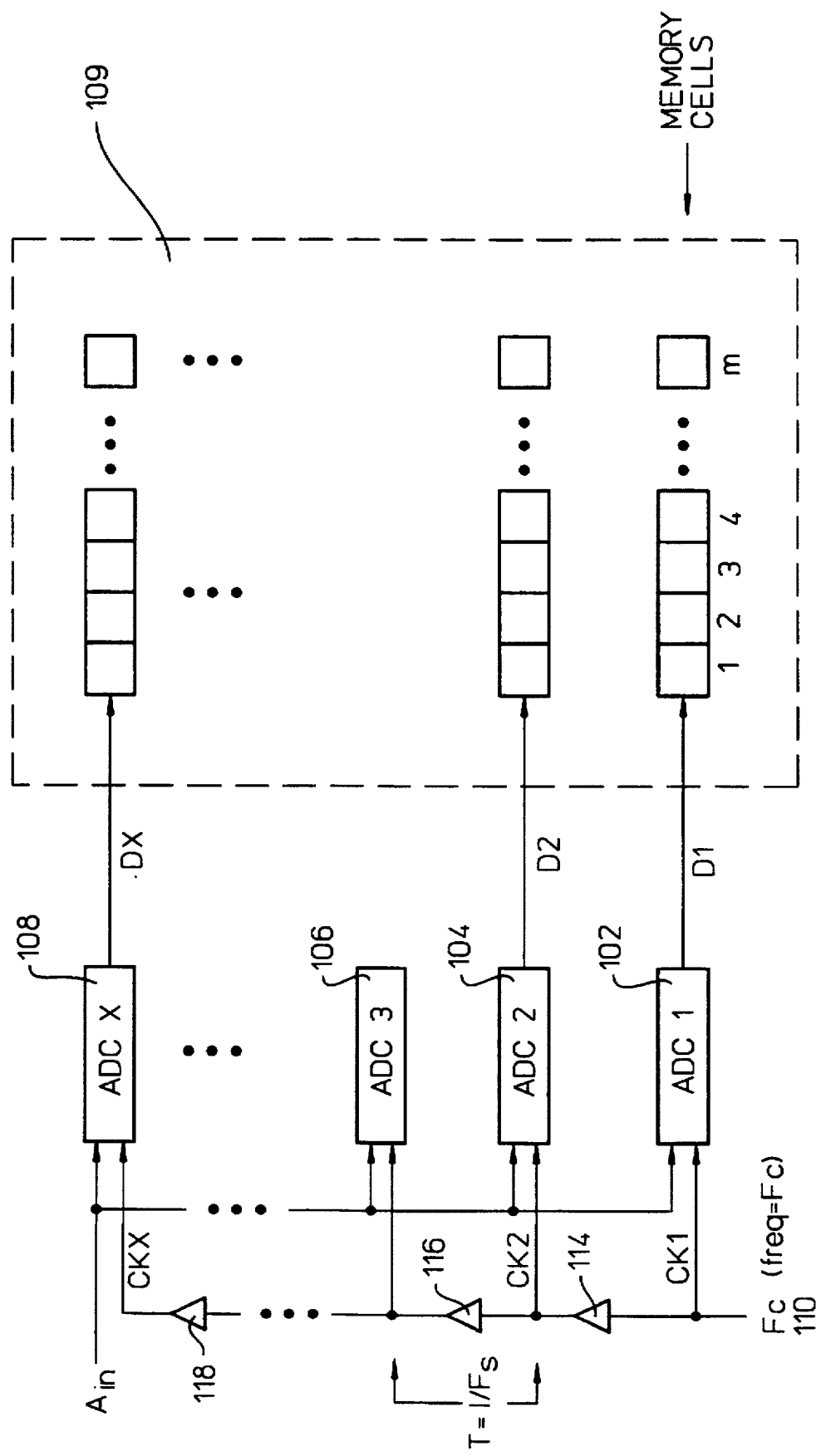
FIG. 1 is a block diagram of a signal sampling interleave and storage system as known in the prior art.

As shown in the drawings for purposes of illustration, the invention is embodied in a novel data sample storage technique in an interleaved sampling system. Previous interleaved sampling system memory storage allocation limitations and excess power dissipation have been overcome. In accordance with the invention, decimation of the sampled data is accomplished by turning off a selection of the sampling ADCs of the interleave sampling system. By incorporating a bank of switches and storage elements at the outputs of the ADCs, it is possible to optimize the allocation of memory on an interleave sampling system chip. It is also possible to reduce the number of writes to memory, resulting in less dissipation of power.

This invention presents a new skip-and-shift decimation (SSD) scheme that allows the sample rate of a time-interleaved ADC system as shown in FIG. 1 to be lowered without altering the clock frequency Fc or changing the clock stage delays T. The number of useful stored samples remains the same for all sample rates. SSD has the property of reducing the total ADC power consumption proportionately with the reduction of the sample rate. In addition, the power dissipated in the memory associated with writing the samples is also lowered by the same factor.

Integrated circuit chips using the SSD time interleaved capability can be used in a wide range of applications. The reduction in power consumption while maintaining the maximal number of stored useful samples allows a great amount of flexibility. The integrated circuit can be used in both high performance products with sampling rates as high as Fs, or in low performance low cost products with a lower sampling rate and lower power dissipation. Hand held instrumentation is an example of a low power application that could benefit from the use this invention.

Figure 4:
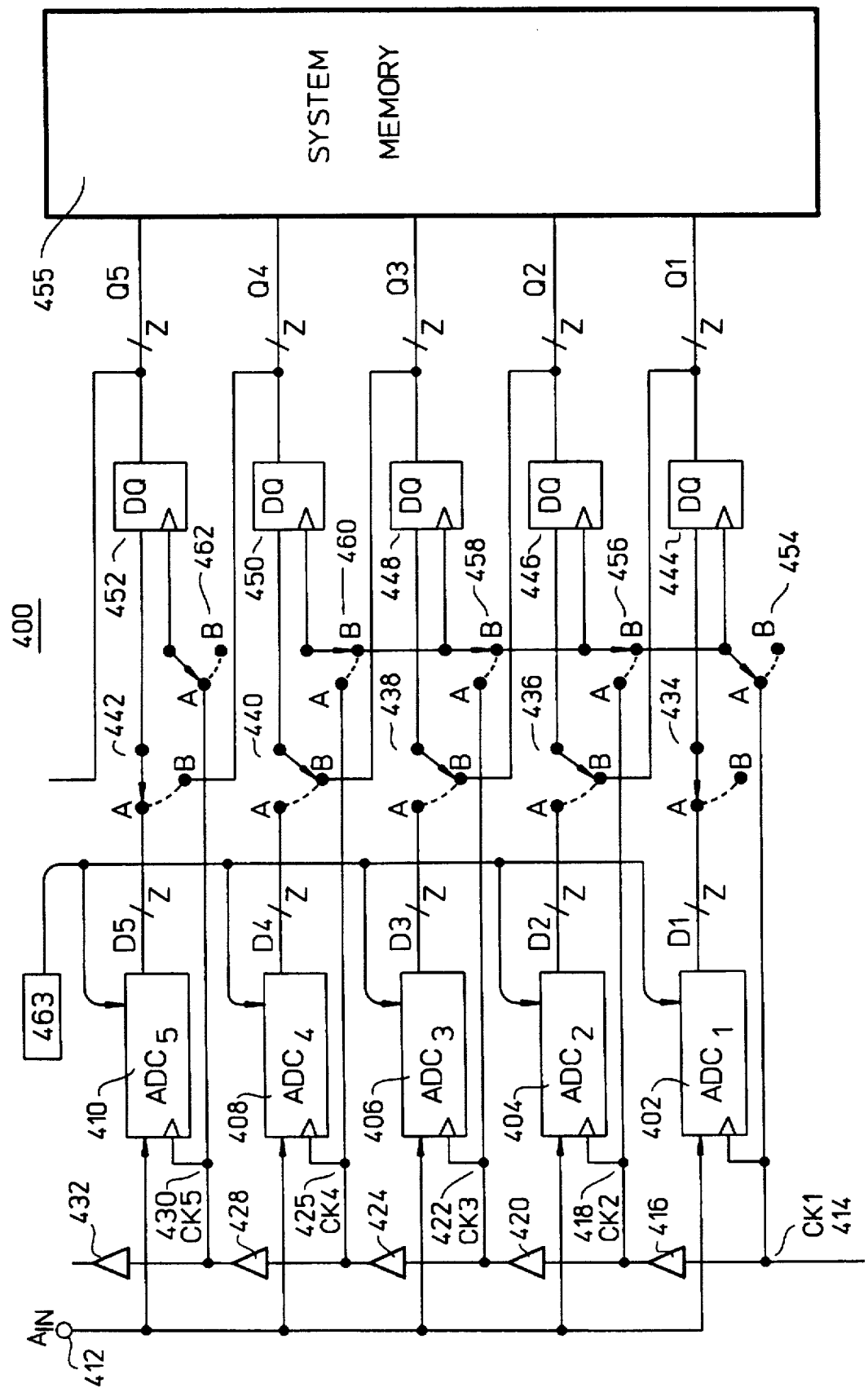
FIG. 4 is a block diagram of an embodiment of the invention that minimizes the number of writes to memory and optimizes the storage of the digital samples in memory.

FIG. 4 shows a basic block diagram of an embodiment of the invention. A plurality of ADCs 402, 404, 406, 408, 410 receive the same analog input ($A_{IN}$) 412. Each ADC 402, 404, 406, 408, 410 produces a plurality of Z bits representing the sampled analog signal. The system 400 receives a clock signal (CK1) 414. The system sampling rate Fs is determined by multiplying the frequency of the clock signal (CK1) 414 with the number of ADCs (X) of the sampling system 400. Time delay elements 416, 420, 424, 428, 432 delay the clock signal 414 between the clock inputs of each of the ADCs 402, 404, 406, 408, 410. The time delay element T is set to the period of the system sampling rate Fs. The first ADC 402 receives the clock signal 414 directly. The second ADC 404 receives the clock signal 414 delayed by T. The third ADC 406 receives the clock signal 414 delayed by 2*T. The fourth ADC 409 receives the clock delayed by 3*T. The fifth ADC 410 receives the clock signal 414 delayed by 4*T.

The outputs of the ADCs 402, 404, 406, 408, 410 are received by a first input of a set of ADC switches 434, 436, 438, 440, 442, respectively. That is, the output of the first ADC 402 is received by the first input of the first ADC switch 434, the output of the second ADC 404 is received by the first input of the second ADC switch 436, and the output of the third ADC 406 is received by the first input of the third ADC switch 438. This systematic connection configuration continues for the rest of the ADC's 408, 410.

The outputs of the ADC switches 434, 436, 438, 440, 442 are received by a set of D-flip-flop units 444, 446, 448, 450, 452, respectively. Each D-flip-flop unit 444, 446, 448, 450, 452 comprises Z D-flip-flops and stores Z bits. The D-flip-flop units 444, 446, 448, 450, 452 may be replaced with latch units, wherein each latch unit comprises Z latches and stores Z-bits. The output of the first ADC switch 434 is received by the first D-flip-flop unit 444, the output of the second ADC switch 436 is received by the second D-flip-flop unit 446, and the output of the third ADC switch 438 is received by the third D-flip-flop unit 448. This systematic connection configuration is the same for the rest of the ADC's 408, 410.

The outputs of the D-flip-flop units 444, 446, 448, 450, 452 are connected to both the sampling system memory 455 and a second input of the ADC switches 436, 438, 440, 442. More precisely, the output of the first D-flip-flop unit 444 is connected to the system memory and to the second input of the second ADC switch 436, the output of the second D-flip-flop unit 446 is connected to the system memory and to the second input of the third ADC switch 438, and so on.

A set of clock switches 454, 456, 458, 460, 462 are configured to determine the signal which drives a clock input of the D-flip-flop units 444, 446, 448, 450, 452. The clock switches 454, 456, 458, 460, 462 receive the delayed clock signal that corresponds to the ADC associated with each particular clock switch, and the clock switches 454, 456, 458, 460, 462 receive the signal driving the clock of the previous D-flip-flop unit. More specifically, the first clock switch 454 receives the clock signal 414. The second clock switch 456 receives the delayed clock signal 418 which drives the clock input of the second ADC 404, and the second clock switch 456 receives the signal that drives the clock input of the first D-flip-flop unit 444. The third clock switch 458 receives the delayed clock signal 422 which drives the clock input of the third ADC 406, and the third clock switch 458 receives the signal that drives the clock input of the second D-flip-flop unit 446. This systematic connection configuration is the same for the rest of the clock switches 460, 462.

The effective system sampling rate is reduced to Fs/N by only activating every Nth ADC. A controller 463 determines which ADCs to activate. The samples of the active ADCs initially are stored in the storage elements (depicted as D-flip-flops in FIG. 4) attached to the active ADCs and are successively shifted into the D-flip-flop units of inactive ADCs. This allows the number of useful memory cells within the system memory 455 to remain at a maximal value and the memory storage capabilities to be optimized. The shifting of the samples is accomplished with the set of D-flip-flop units (DFFs) 444, 446, 448, 450, 452 which are placed between the ADCs 402, 404, 406, 408, 410 and the system memory 455. One of the ADC switches is connected to the D-input of each DFF 444, 446, 448, 450, 452. One of the clock switches is connected to the clock input of each DFF 444, 446, 448, 450, 452. When all of the ADC switches 434, 436, 438, 440, 442 and the clock switches 454, 456, 458, 460, 462 are in the position "A",the ADC system 400 operates at the maximum sample rate. For lower sample rates, ADCs are turned off and the switches associated with the inactive ADCs are set to position "B". This configuration of the DFFs creates a shift register wherein the sampled data of the active ADCs are shifted through the DFFs of the inactive ADCs. Each DFF making up the shift register accepts data samples from the DFF below and then passes the sample to the DFF above. Before the last sample in the shift register is shifted out, the contents of all the shift register outputs are written in parallel into system memory 455. Basically, the samples from the active ADCs are temporarily stored in the DFFs of the inactive ADCs which leads to full utilization of the system memory 455 as the system sample rate is lowered.

An example of Skip and Shift decimation of a factor of four is illustrated by the switch settings shown in FIG. 4. For this configuration, the system sampling rate Fs will be the interleave factor (I) multiplied by the frequency of ADC clock signal (CK1) 414 divided by the decimation factor N of four. For every group of four ADCs, only one ADC is active. The other three ADCs are turned off. For this example, the first ADC 402 is active, while the next three ADCs 404, 406, 408 are turned off. The ADC switch 434 associated with the active first ADC 402 is set to position A. The other three ADC switches 436, 438, 440 associated with the non-active ADCs 404, 406, 408 are set to position B. The clock switch 454 associated with the active first ADC 402 is also set to position A. The other three clock switches 456, 458, 460 associated with the inactive ADCs are set to position B. On every positive edge of the clock signal 414 the active ADC 402 produces a new sample. Every successive positive edge of the clock 414 causes the DFFs to shift the sample held by the any one DFF to the next DFF. On every fourth edge of the clock 414 the data in the effective shift register comprising the DFFs is written into memory. This same configuration and process occurs in all the other groups of four ADCs.

Figure 5:
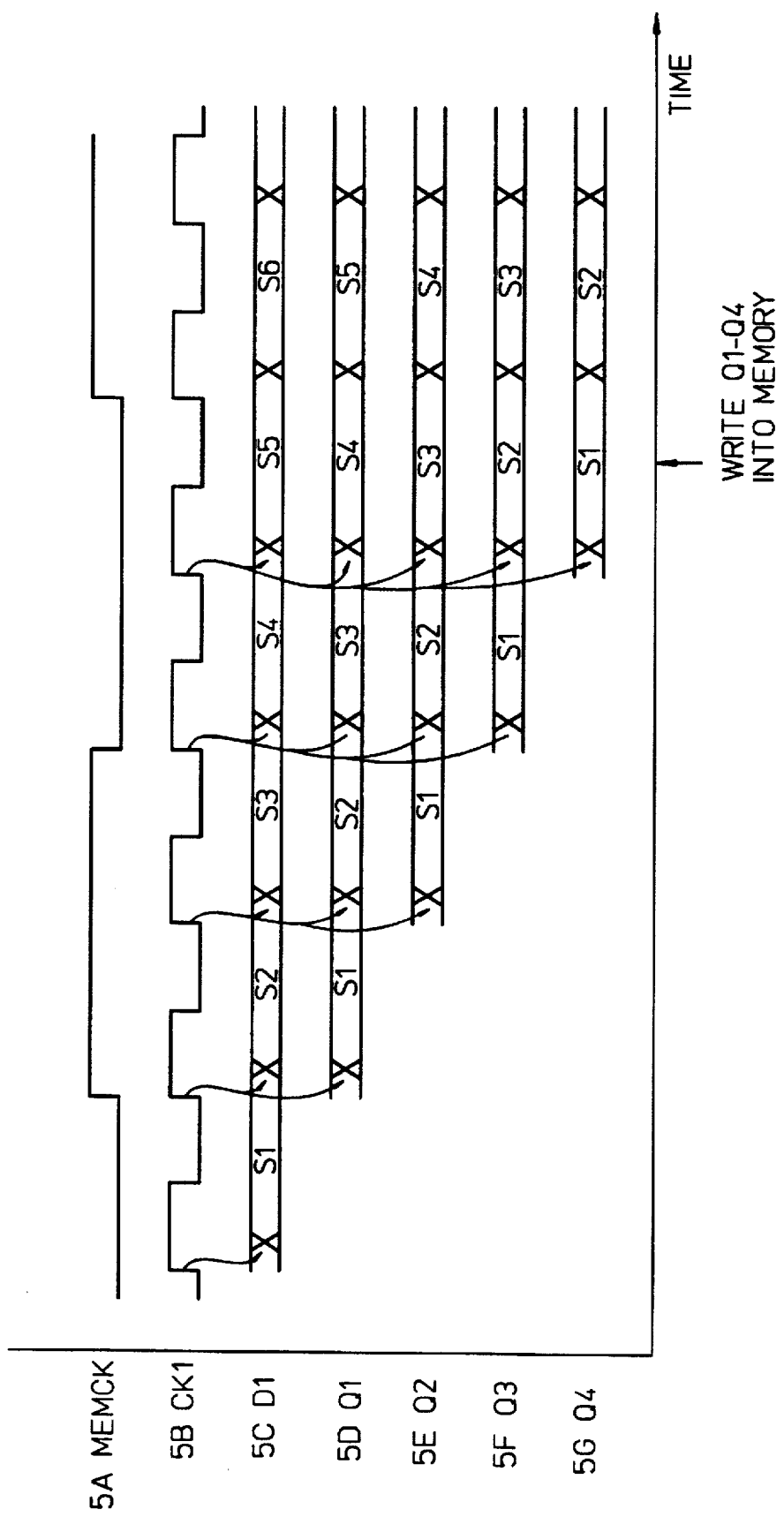
FIG. 5 is a timing diagram of the outputs of the memory element depicted in FIG. 4.

FIGS. 5 shows a timing diagram of the states (outputs) of the DFFs associated with the first group of four ADCs. Trace 5A shows the memory clock wherein writes to the system memory are made on the rising edge of the memory clock. Trace 5B shows the system clock. Trace 5C shows that at the start of a sample period, the first ADC 402 outputs a sample on the rising edge of the system clock. The first sample is designated S1 on the timing diagram. Trace 5D shows that on the next system clock edge the S1 sample is loaded into the first DFF 444. Simultaneously, the second sample S2 is generated by the first ADC 402. Trace 5E shows that on the next system clock edge, the S1 sample is clocked into the second DFF 446. Simultaneously, the S2 sample is loaded into the first DFF 444 and the third sample S3 is generated by the first ADC 402. Trace 5F shows that on the next clock cycle, the sample S1 is loaded into the third DFF 448. Simultaneously, the sample S2 is loaded into the second DFF 446, the sample S3 is loaded into the first DFF 444 and the sample S4 is generated by the first ADC 402. Trace 5G shows that on the next clock cycle, the sample S1 is loaded into the fourth DFF 450. Simultaneously, the sample S2 is loaded into the third DFF 448, the sample S3 is loaded into the second DFF 446 and the sample S4 is loaded into the first DFF 444 and the sample S5 generated by the first ADC 402. At this point, the four DFFs of the group have all been loaded with valid sample data. The valid sample data loaded into the DFFs is written into the system memory on the rising edge of the memory clock.

Prior art interleave systems perform a memory write on every clock cycle. However, with the present system the number of memory writes is reduced in proportion to the amount of decimation desired. In this example, the decimation is set to four. Therefore, the writes to memory occur on every fourth clock cycle and the number of memory writes is reduced by a factor of four. The result is that the power dissipation due to memory writes is reduced by 75%.

In the general case, SSD will work for all levels of decimation N less than the interleave factor X if X/N is an integer. If N is less than or equal to X and X/N is an integer, then for a set of X ADCs, the active ADCs of the set are given by the following formula:

$$Aj=[(j-1)*N]+1$$

where j=1 ... (X/N) and Aj designates the active ADCs. All other ADCs of the set will be inactive. For example, if the interleave factor X is 32 (there are 32 ADCs in the system) and the decimation factor N is 4 (only ¼ the data samples are desired), then the active ADCs will be:

$$Aj=1, 5, 9, 13, 17, 21, 25, 29.$$

These represent the active ADCs, and the rest of the set of 32 ADCs will be inactive.

Figure 6:
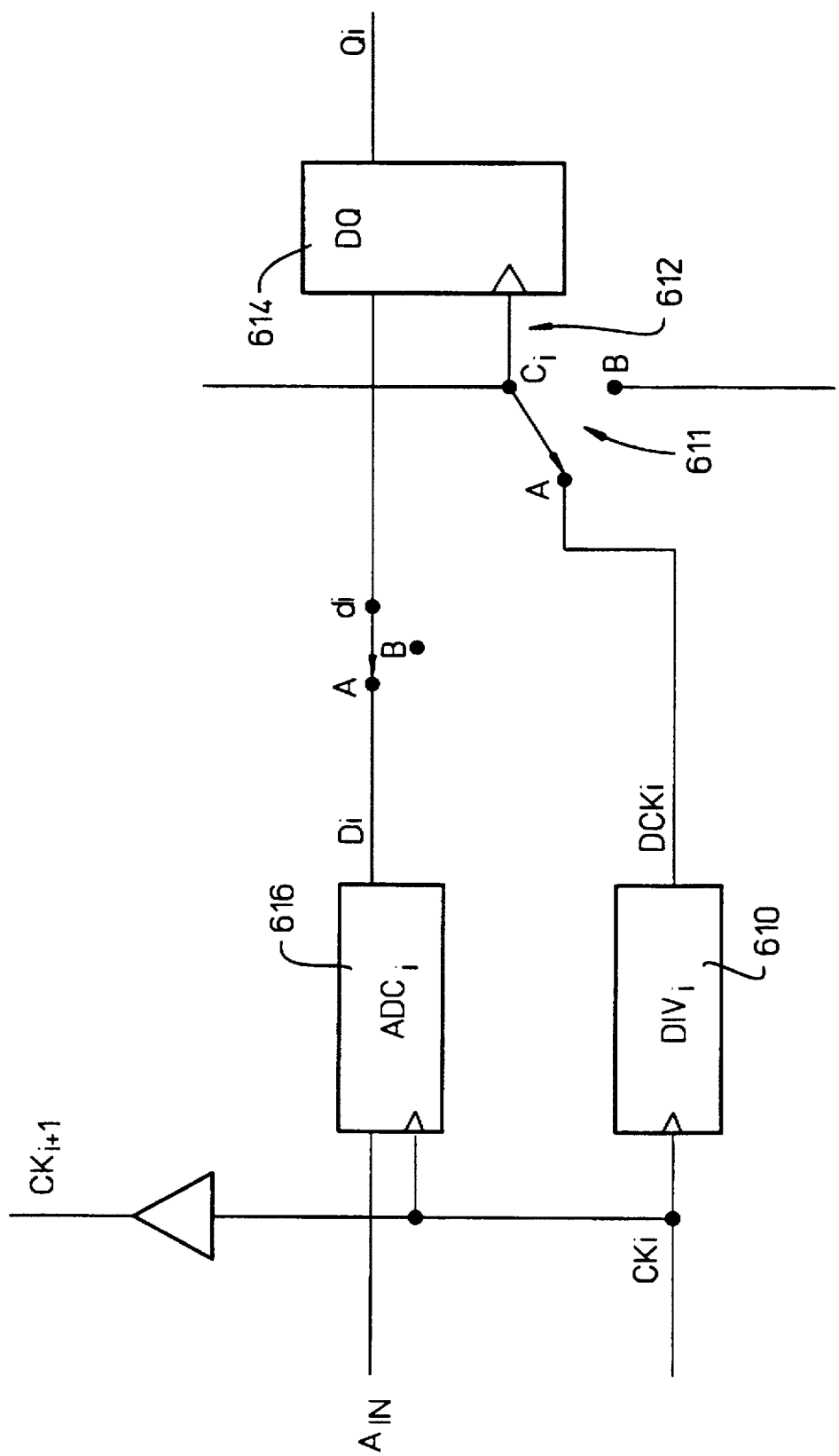
FIG. 6 is a block diagram of another embodiment of the invention.

In another embodiment of this invention, the decimation factor N may be greater than the interleave factor X. As shown in FIG. 6, for N greater than X, a presettable divider 610 must be inserted previous to the clock switch 611 which drives the clock input 612 of the DFF 614 that corresponds to the active ADC 616. Generally, every ADC of the time-interleaved ADC system according to this embodiment will have an associated presettable divider.

Each presettable divider 610 of the sampling system must be preset with both a predetermined initial state (S) and a divide ratio (R). Both of these variables are preset only once for a given decimation factor and interleave factor, and can be programmed by an external microprocessor. S and R are fixed integers for a given decimation factor N.

The SSD will work for N>X if the following two equations can be satisfied with all of the variables being integers:

$$X=Q*E$$

$$N=Q*R$$ where X is the interleave factor, N is the decimation factor, Q is an integer, R is the divide ratio of the presettable divider associated with the active ADCs and E is the number of the X ADCs which are active.

The active ADCs (Aj) and the initial states (Sj) of the dividers associated with the active ADCs are given by:

$$Aj=[((j-1)*N) \bmod X]+1 \text{ where } j=1 \quad E$$

$$Sj=(R-1)-[((j-1)*N) \text{ div } X] \text{ where } j=1 \quad E$$

For these equations, 'x mod y' is defined as the integer remainder of the result when x is divided by y, and 'x div y' is the integer quotient of the result when x is divided by y.

Similar to the case where N<=X, the switches associated with the active ADCs are in position A, and the switches associated with the inactive ADCs are set to position B.

Figure 7:
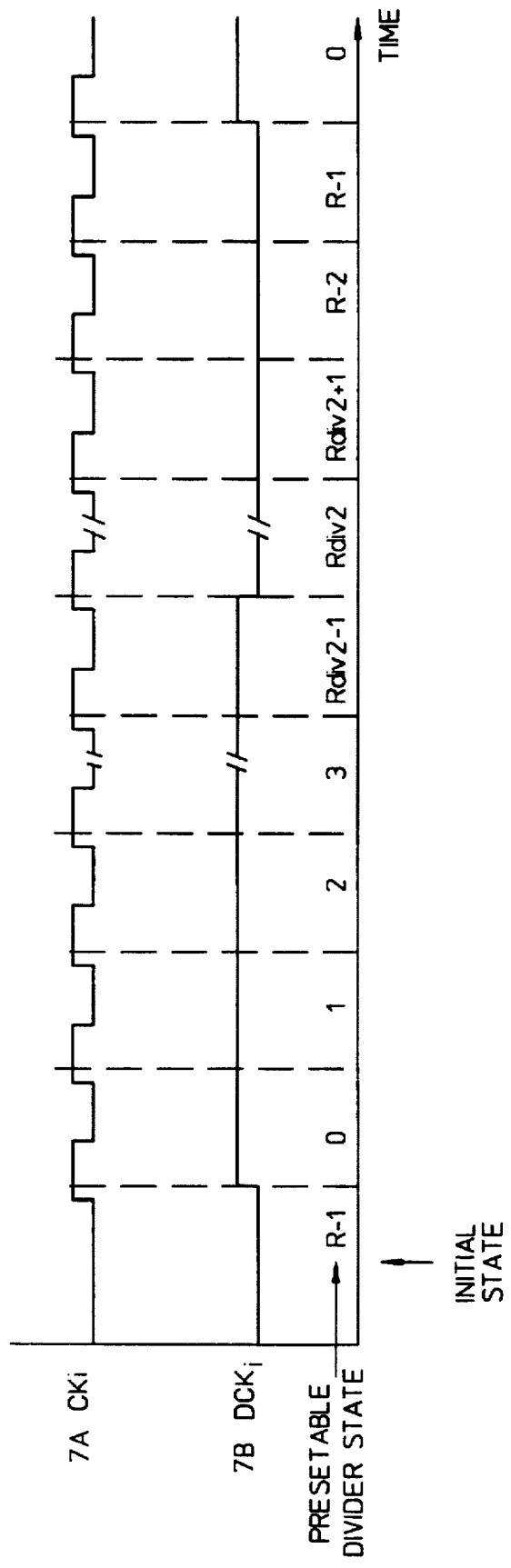
FIG. 7 is a timing diagram of the general waveforms of the block diagram of FIG. 6.

Each divider has R states (S=0 . . . R−1). On every positive clock edge, the divider state (S) increments by 1. The divider output is high for S<R div 2, and low for all other states. At the beginning of a signal acquisition, all active dividers are preset to their respective Sj states while the clock is low (before the first positive clock edge occurs). FIG. 7 shows the timing diagram of a clock signal and the output waveform of a presettable divider.

Figure 8:
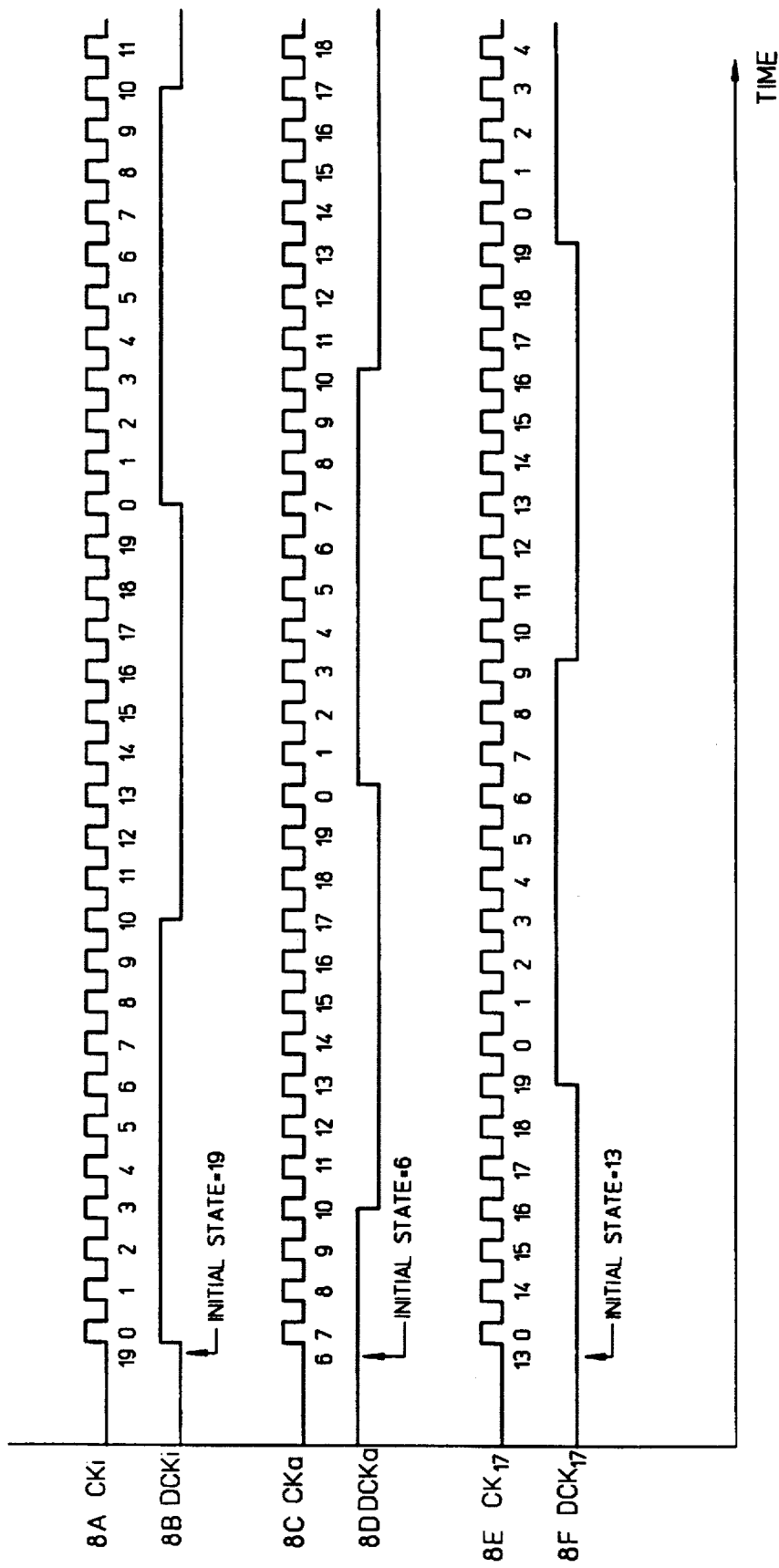
FIGS. 8 is a timing diagram of the delayed clock signals and the divider waveforms of the embodiment of the invention shown in FIG. 6.

As an example, consider an interleave ADC system with an interleave factor X of 24 in which it is desired to decimate the sampling by 160. The equations previously given for decimation with N greater than X must first be satisfied.

$$24=Q*E$$

$$160=Q*R$$

where Q is an integer, R is the divide ratio of the presettable dividers associated with the active ADCs and E is the number of the 24 ADCs which are active. Picking Q=8 yields the result of E=3 and R=20. With these numbers the ADCs to be activated and the preset states of the presettable dividers may be determined. The equations previously given:

$$Aj=[((j-1)*N \bmod X]+1 \text{ where } j=1 \quad E$$

$$Sj=(R-1)-[((j-1)*N) \text{ div } X] \text{ where } j=1 \quad E$$

yield activated ADCs of A1=1, A2=17, A3=9 and divider preset values of S1=19, S2=13, S3=6. These results indicate that to correctly decimate by 160 in an interleave system of 24 ADCs, only ADCs 1, 17 and 9 should be activated. The results also indicate that the clocks of the DFFs associated with these activated ADCs should be driven by the corresponding delayed ADC sampling clock divided by 20. Furthermore, the divider associated with the number 1 DFF should be preset to 19, the divider associated with the number 17 DFF should be preset to 13 and the divider associated with the number 9 DFF should be preset to 6. The preset conditions must only be set once for a given value of decimation. FIGS. 8 shows the ADC sampling clocks and the divider output waveforms for this example.

Although specific embodiments of the invention have been described and illustrated, the invention is not to be limited to the specific forms or arrangements of parts so described and illustrated. The invention is limited only by the claims.

I claim:

1. A high speed analog to digital converter, decimation and storage system comprising:

a plurality of X analog to digital converters receiving an analog signal, a jth one of the analog to digital converters generating a digital sample of the analog signal responsive to a sampling clock signal having a period X*T and delayed in time by ((j−1)*T);

means for receiving a user defined decimation factor N;

means for activating at least one of the X ADCs as a function of the decimation factor N;

a plurality of X storage elements having outputs, a jth storage element receiving the digital sample from the jth analog to digital converter if the jth analog to digital converter is active and receiving the output from a (j−1)th storage element if the jth analog to digital converter is not active;

an array of memory cells receiving the outputs from the storage elements; and means for writing the outputs of the storage elements into the array of memory cells when all the storage elements have been loaded with digital samples subsequent to any prior memory writes, wherein the data samples written to the memory cells represent the analog signal sampled at a rate of (1/N)*(X/T).

2. The high speed analog to digital converter, decimation and storage system as recited in claim 1, wherein if the decimation factor N<=X, then X/N is an integer;

the means for activating at least one of the X ADCs activates the jth ADC when j=((k−1)*N)1 where k is an integer that varies from 1 to X/N; and the digital sample from the jth analog to digital converter is loaded into the jth storage element responsive to the sampling clock signal delayed in time by ((j−1)*T) if the jth analog to digital converter is activated and the digital sample from the (j−1)th storage element is loaded into jth storage element responsive to a clock signal from the (j−1)th storage element if the jth analog to digital converter is not activated.

3. The high speed analog to digital converter, decimation and storage system as recited in claim 1, wherein each storage element comprises a plurality of D-flip-flop units.

4. The high speed analog to digital converter, decimation and storage system as recited in claim 1, wherein each storage element comprises a plurality of latch units.

5. The high speed analog to digital converter, decimation and storage system as recited in claim 1, further comprising a plurality of presettable dividers having outputs, a jth presettable divider being initialized to a setting of S and receiving and dividing by a factor of R the sampling clock signal delayed in time by ((j−1)*T), wherein:

if N<=X, then R=1, and if N>X, then (R*X)/N in an integer;

the means for activating at least one of the X ADCs comprises means for activating the jth ADC when j=(((k−1)*N) mod X)+1 where k=1 to ((R*X)/N); and the digital sample from the jth analog to digital converter is clocked into the jth storage element responsive to the output of the jth presettable divider when the jth analog to digital converter is activated and the digital sample from the (j−1)th storage element is clocked into the jth storage element responsive to a clock signal of the (j−1)th storage element if the jth analog to digital converter is not active.

6. The high speed analog to digital converter, decimation and storage system as recited in claim 5, and further comprising means, operable only if N>X, for initializing the jth presettable divider to a setting S=(R−1)−(((k−1)*N) div X) when j=(((k−1)*N) mod X)+1 where k=1to ((R*X)/N).

7. A method of digitizing, decimating by a user defined decimation factor N, and storing digital samples of an analog signal, the method comprising the steps of:
 a. creating digital samples by sampling the analog signal with a plurality of X ADCs wherein at least one of the ADCs is set active depending on a function of N, and wherein a jth ADC is clocked by a sampling signal having a period X*T and delayed in time by ((j−1)*T);
 b. clocking the digital samples into a plurality of X storage elements wherein a jth storage element corresponds to the jth ADC and the jth storage element receives the digital sample generated by the jth ADC if the jth ADC is active and the jth storage element receives an output from a (j−1)th storage element if the jth ADC is not active; and
 c. writing the digital samples stored in the X storage elements to a system memory when a digital sample has been clocked into all of the storage elements subsequent to any prior memory writes, wherein the data samples written to the memory cells represent the analog signal sampled at a rate of (1/N)*(X/T).

8. The method of digitizing, decimating and storing digital samples of an analog signal as recited in claim 7, wherein N<=X, X/N is an integer and at least one of the ADCs is set active in step a by turning on the jth ADC when j=((k−1)*N)+1 where k is an integer that varies from 1 to X/N.

9. The method of digitizing, decimating and storing digital samples of an analog signal as recited in claim 7, wherein
 the digital samples from the active jth analog to digital converter is clocked into the jth storage element by a jth presettable divider having a presettable initial setting of S and divide ratio of R and the presettable divider receives the sampling signal delayed in time by (j*(T/X)); and wherein if N<=X, then R is equal to one; and if N>X, then ((R*X)/N) is an integer and at least one of the ADCs is set active in step a by turning on the jth ADC when j=(((k−1)*N) mod X+1 where k=1 to ((R*X)/N).

10. The method of digitizing, decimating and storing digital samples of a high speed analog waveform as recited in claim 9, wherein the initial setting S of the jth presettable divider is (R−1)−(((k=1)*N) div X) when j=(((k−1)*N) mod X)+1 where k=1 to ((X)/N).

11. A high speed analog to digital converter, decimation and storage system comprising:
 a plurality of X analog to digital converters receiving an analog signal, a jth one of the analog to digital converters generating a digital sample of the analog signal responsive to a sampling clock signal having a period X*T and delayed in time by ((j−1)*T);
 means for receiving a user defined decimation factor N;
 means for activating less than all of the X ADCs as a function of the decimation factor N;
 a plurality of X storage elements having outputs, a jth storage element receiving the digital sample from the jth analog to digital converter if the jth analog to digital converter is active and receiving the output from a (j−1)th storage element if the jth analog to digital converter is not active;
 an array of memory cells receiving the outputs from the storage elements; and
 means for writing the outputs of the storage elements into the array of memory cells when all the storage elements have been loaded with digital samples subsequent to any prior memory writes, wherein the data samples written to the memory cells represent the analog signal sampled at a rate of (1/N)*(X/T).

* * * * *